(12) United States Patent
Chan et al.

(10) Patent No.: US 10,629,494 B2
(45) Date of Patent: Apr. 21, 2020

(54) SEMICONDUCTOR DEVICE AND METHOD

(71) Applicant: Taiwan Semiconductor Manufacturing Company, Ltd., Hsinchu (TW)

(72) Inventors: Chia-Ling Chan, New Taipei (TW); Yen-Chun Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 2 days.

(21) Appl. No.: 15/633,418

(22) Filed: Jun. 26, 2017

(65) Prior Publication Data
US 2018/0374760 A1 Dec. 27, 2018

(51) Int. Cl.
| | |
|---|---|
| *H01L 29/08* | (2006.01) |
| *H01L 21/8238* | (2006.01) |
| *H01L 21/3115* | (2006.01) |
| *H01L 21/324* | (2006.01) |
| *H01L 21/223* | (2006.01) |
| *H01L 29/66* | (2006.01) |
| *H01L 21/266* | (2006.01) |
| *H01L 21/225* | (2006.01) |
| *H01L 29/167* | (2006.01) |
| *H01L 29/207* | (2006.01) |

(52) U.S. Cl.
CPC .. *H01L 21/823814* (2013.01); *H01L 21/2236* (2013.01); *H01L 21/2254* (2013.01); *H01L 21/266* (2013.01); *H01L 21/3115* (2013.01); *H01L 21/31155* (2013.01); *H01L 21/324* (2013.01); *H01L 21/823821* (2013.01); *H01L 29/0847* (2013.01); *H01L 29/66795* (2013.01); *H01L 29/66803* (2013.01); *H01L 29/167* (2013.01); *H01L 29/207* (2013.01)

(58) Field of Classification Search
CPC ............. H01L 21/324; H01L 29/66803; H01L 21/2254; H01L 29/167
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 9,450,078 B1 * | 9/2016 | Tang | H01L 29/66795 |
| 9,583,489 B1 * | 2/2017 | Anderson | H01L 27/0921 |
| 2001/0034088 A1 * | 10/2001 | Nakamura | H01L 21/3226 438/166 |
| 2003/0113999 A1 * | 6/2003 | Jang | H01L 21/28518 438/685 |
| 2005/0224786 A1 * | 10/2005 | Lin | H01L 21/2236 257/19 |

(Continued)

FOREIGN PATENT DOCUMENTS

| | | |
|---|---|---|
| KR | 20160125870 A | 11/2016 |
| WO | 2016104206 A1 | 6/2016 |

*Primary Examiner* — Jaehwan Oh
(74) *Attorney, Agent, or Firm* — Slater Matsil, LLP

(57) ABSTRACT

A method includes forming a spacer layer over a semiconductor fin protruding above a substrate, doping the spacer layer using a first dopant while the spacer layer covers source/drain regions of the semiconductor fin, and performing a thermal anneal process after the doping.

20 Claims, 15 Drawing Sheets

(56) References Cited

U.S. PATENT DOCUMENTS

| | | | |
|---|---|---|---|
| 2006/0131636 A1* | 6/2006 | Jeon | H01L 29/42324 257/315 |
| 2010/0190326 A1* | 7/2010 | Joung | H01L 21/76886 438/586 |
| 2011/0049628 A1* | 3/2011 | Okumura | H01L 21/2236 257/347 |
| 2011/0147856 A1* | 6/2011 | Sasaki | H01L 29/66795 257/401 |
| 2011/0195555 A1* | 8/2011 | Tsai | H01L 21/2236 438/301 |
| 2011/0269287 A1* | 11/2011 | Tsai | H01L 21/2254 438/306 |
| 2012/0070953 A1* | 3/2012 | Yu | H01L 21/2236 438/301 |
| 2012/0225543 A1* | 9/2012 | Ohno | H01L 21/02554 438/479 |
| 2012/0292715 A1* | 11/2012 | Hong | H01L 21/845 257/392 |
| 2013/0264563 A1* | 10/2013 | Okazaki | H01L 29/66742 257/43 |
| 2014/0282326 A1 | 9/2014 | Chen et al. | |
| 2015/0140751 A1* | 5/2015 | Yu | H01L 21/823857 438/230 |
| 2016/0042952 A1* | 2/2016 | Tsai | H01L 29/6653 438/154 |
| 2016/0099150 A1* | 4/2016 | Tsai | H01L 21/2252 257/401 |
| 2016/0307772 A1* | 10/2016 | Choi | H01L 21/31116 |
| 2016/0315191 A1* | 10/2016 | Tsai | H01L 29/66803 |
| 2017/0011967 A1* | 1/2017 | Yeo | H01L 21/823814 |
| 2017/0179290 A1* | 6/2017 | Lo | H01L 21/2236 |
| 2017/0207126 A1* | 7/2017 | Ching | H01L 29/7848 |
| 2017/0250278 A1* | 8/2017 | Tsai | H01L 29/7833 |
| 2018/0012763 A1* | 1/2018 | Ueda | H01J 37/32266 |

\* cited by examiner

SEMICONDUCTOR DEVICE AND METHOD

TECHNICAL FIELD

The present invention relates generally to semiconductor device fabrication, and, in particular embodiments, to formation of Fin Field-Effect Transistor (FinFET) devices.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As transistor sizes decrease, the size of each feature decreases. For example, in FinFET devices, the pitch (e.g., distance) between adjacent fins becomes so small that during implantation of dopant, the angle of implantation is limited by the small pitch between adjacent fins, which may result in non-uniform dopant distribution in the fins of the FinFET device. There is a need in the art for processing methods that could accommodate the small feature sizes in advanced process technologies.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
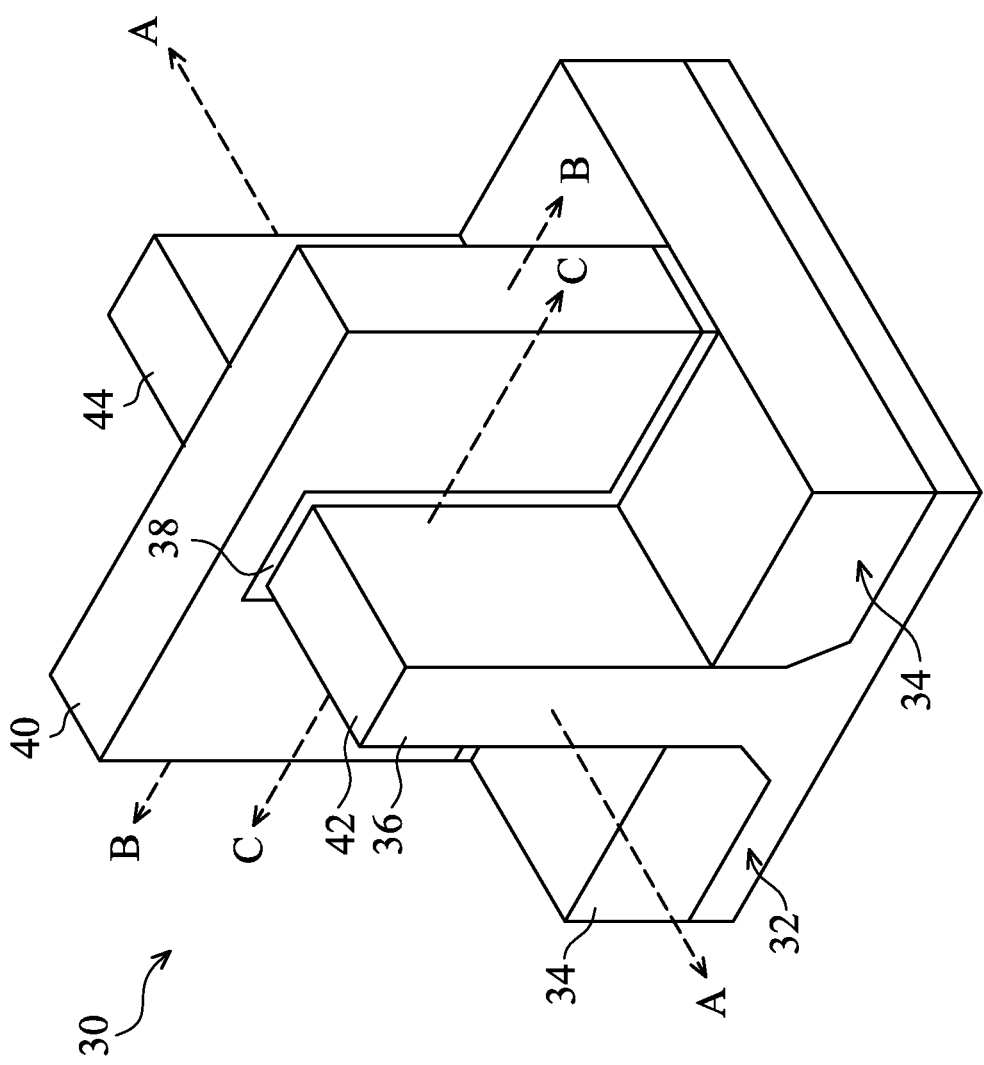
FIG. 1 is a three-dimensional view of a Fin Field-Effect Transistor (FinFET)

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates an example of a FinFET 30 in a three-dimensional view. The FinFET 30 includes a substrate 32 having a fin 36. The fin 36 protrudes above isolation regions 34 disposed on opposing sides of the fin 36. A gate dielectric 38 is along sidewalls and over a top surface of the fin 36, and a gate electrode 40 is over the gate dielectric 38. Source/drain regions 42 and 44 are in the fin on opposite sides of the gate dielectric 38 and gate electrode 40. FIG. 1 further illustrates reference cross-sections that are used in later figures. Cross-section B-B extends along a longitudinal axis of the gate electrode 40 of the FinFET 30. Cross-section C-C is parallel to cross-section B-B and is across a source/drain region 42. Cross-section A-A is perpendicular to cross-section B-B and is along a longitudinal axis of the fin 36 and in a direction of, for example, a current flow between the source/drain regions 42 and 44. Subsequent figures refer to these reference cross-sections for clarity.

FIGS. 2-14 are cross-sectional views of a FinFET device 100 at various stages of fabrication in accordance with some embodiments. The FinFET device 100 is similar to the FinFET 30 in FIG. 1, except for multiple fins. FIGS. 2-5 illustrate cross-section views of FinFET device 100 along cross-section B-B. FIGS. 6-10 illustrate cross-section views along cross-section C-C and FIGS. 11-14 illustrate cross-section views along cross-section A-A.

Figure 2:
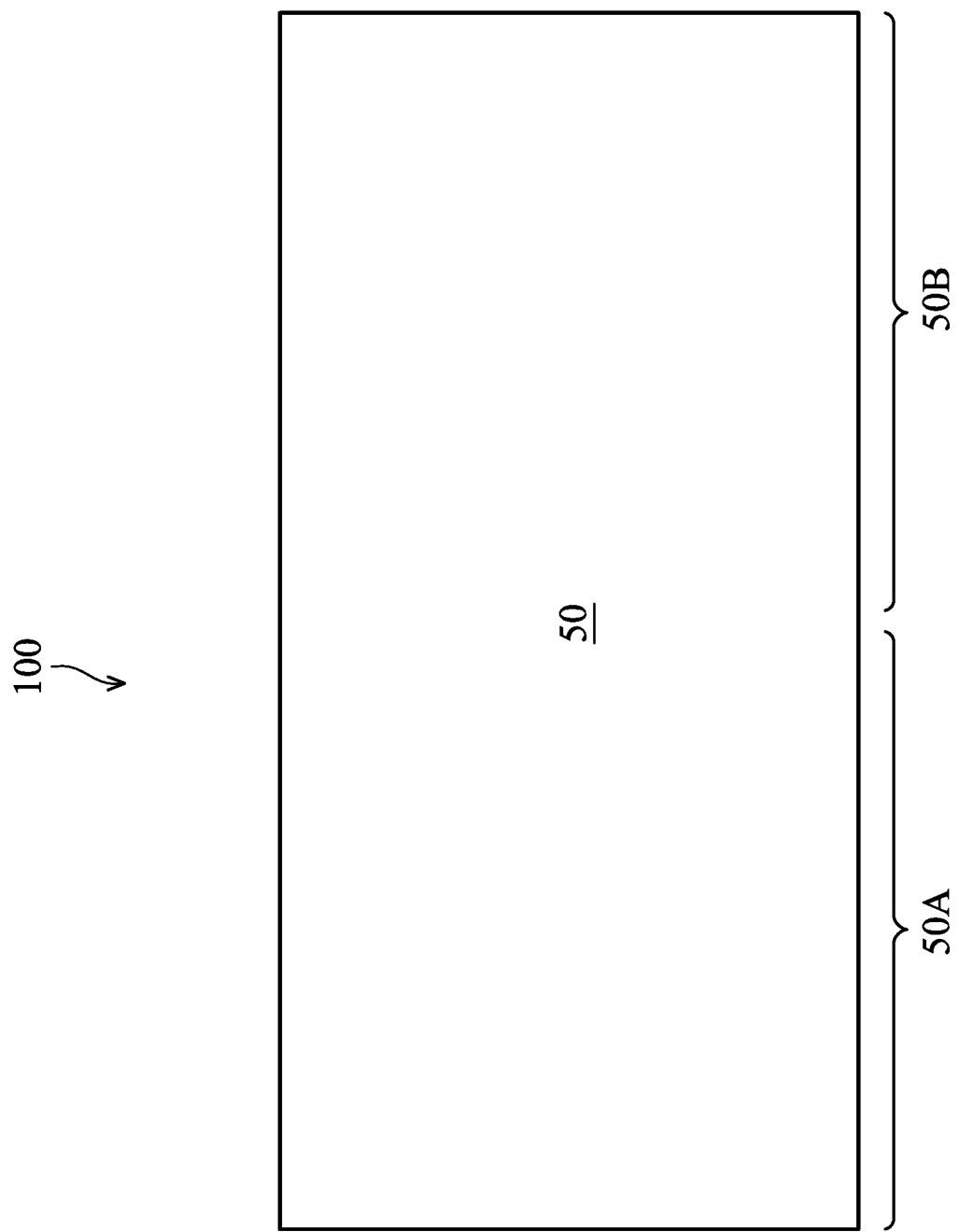
FIGS. 2-14 are cross-sectional views of a FinFET device at various stages of fabrication, in some embodiments.

FIG. 2 illustrates a substrate 50. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 may include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the FinFET. The integrated circuit devices may be formed using any suitable methods.

The substrate 50 has a first region 50A and a second region 50B. The first region 50A may be for forming n-type devices, such as NMOS transistors, such as n-type FinFETs. The second region 50B can be for forming p-type devices, such as PMOS transistors, such as p-type FinFETs.

Figure 3:
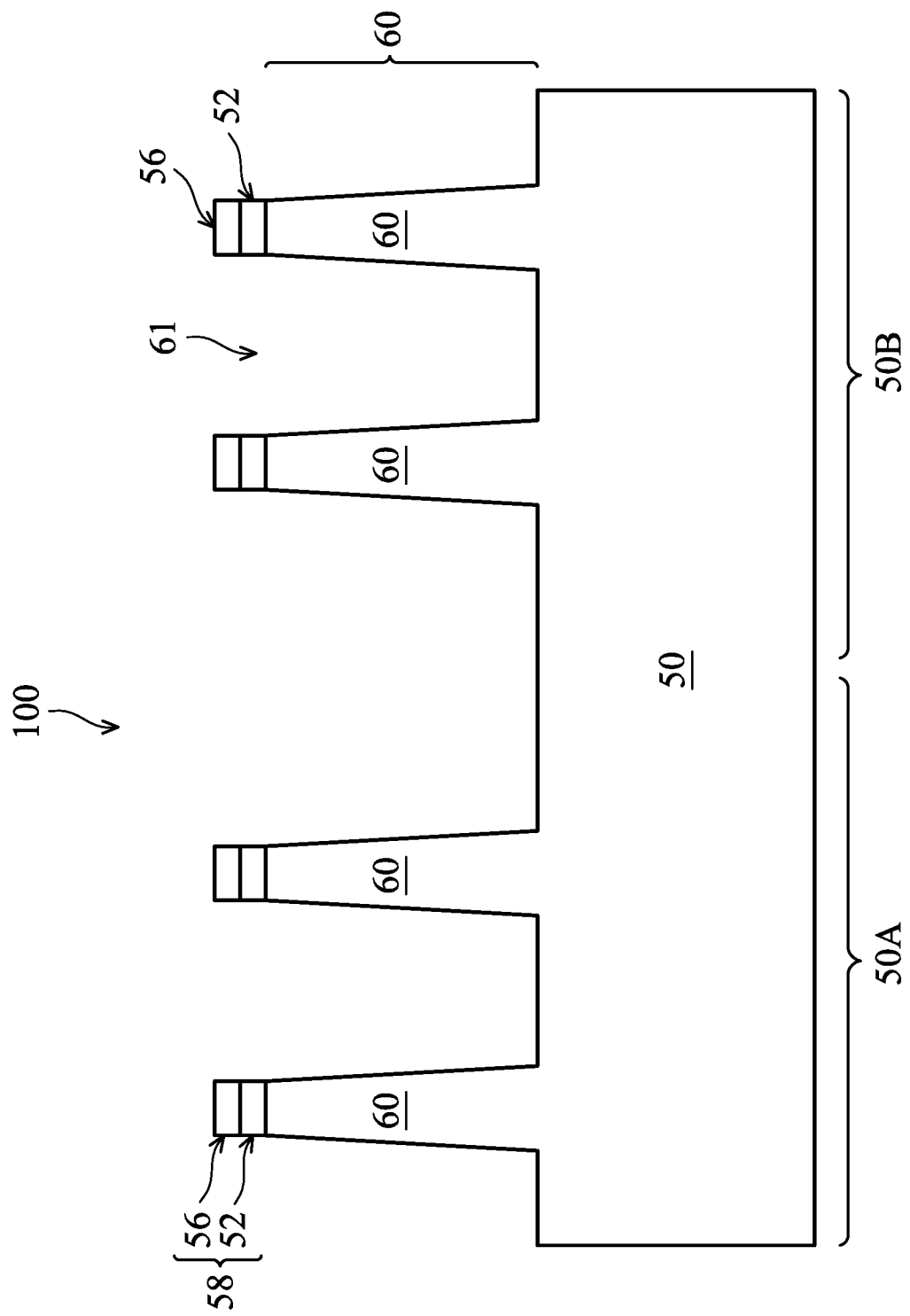

Referring to FIG. 3, the substrate 50 shown in FIG. 2 is patterned using, for example, photolithography techniques. For example, a mask layer, such as a pad oxide layer 52 and an overlying pad nitride layer 56, is formed over the substrate 50. The pad oxide layer 52 may be a thin film comprising silicon oxide formed, for example, using a thermal oxidation process. The pad oxide layer 52 may act as an adhesion layer between the substrate 50 and the overlying pad nitride layer 56. In some embodiments, the pad nitride layer 56 is formed of silicon nitride, silicon oxynitride, silicon carbide, silicon carbonitride, the like, or a combination thereof, and may be formed using low-pressure chemical vapor deposition (LPCVD) or plasma enhanced chemical vapor deposition (PECVD), as examples.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. In this example, the photoresist material is used to pattern the pad oxide layer 52 and pad nitride 56 to form a patterned mask 58, as illustrated in FIG. 3.

The patterned mask 58 is subsequently used to pattern exposed portions of the substrate 50 to form trenches 61, thereby defining semiconductor strips 60 between adjacent trenches 61 as illustrated in FIG. 3. In some embodiments, the semiconductor strips 60 are formed by etching trenches in the substrate 50. The etching may be any acceptable etch process, such as a reactive ion etch (RIE), neutral beam etch (NBE), the like, or a combination thereof. The etch may be anisotropic. In some embodiments, the trenches 61 may be strips (viewed from in the top) parallel to each other, and closely spaced with respect to each other. In some embodiments, the trenches 61 may be continuous and surround the semiconductor strips 60. After semiconductor strips 60 are formed, the patterned mask layer 58 may be removed by etching or any suitable method.

Figure 4:
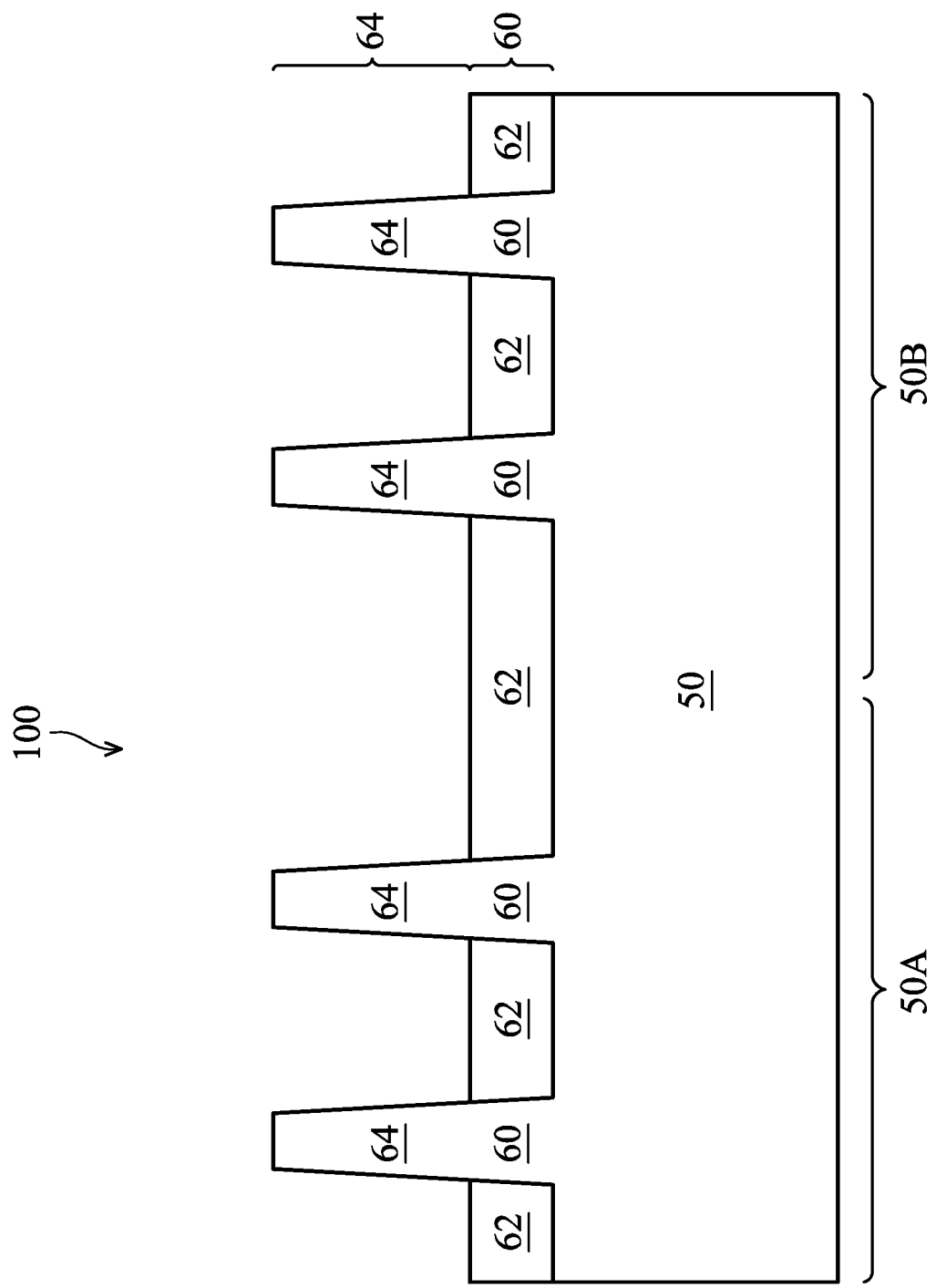

FIG. 4 illustrates the formation of an insulation material between neighboring semiconductor strips 60 to form isolation regions 62. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. A planarization process, such as a chemical mechanical polish (CMP), may remove any excess insulation material (and, if present, the hard mask 56) and form top surfaces of the isolation regions 62 and top surfaces of the semiconductor strips 60 that are coplanar (not shown).

Next, the isolation regions 62 are recessed such as to form shallow trench isolation (STI) regions 62. The isolation regions 62 are recessed such that the upper portions of the semiconductor strips 60 protrude from between neighboring isolation regions 62 and form semiconductor fins 64 (also referred to as fins 64). The top surfaces of the isolation regions 62 may have a flat surface as illustrated, a convex surface, a concave surface (such as dishing), or a combination thereof. The top surfaces of the isolation regions 62 may be formed flat, convex, and/or concave by an appropriate etch. The isolation regions 62 may be recessed using an acceptable etching process, such as one that is selective to the material of the isolation regions 62. For example, a chemical oxide removal using a CERTAS® etch or an Applied Materials SICONI tool or dilute hydrofluoric (dHF) acid may be used.

FIGS. 2 through 4 illustrate an embodiment of forming fins 64, but fins may be formed in various different processes. In one example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins. In another example, heteroepitaxial structures can be used for the fins. For example, the semiconductor strips can be recessed, and a material different from the semiconductor strips may be epitaxially grown in their place. In an even further example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 5:
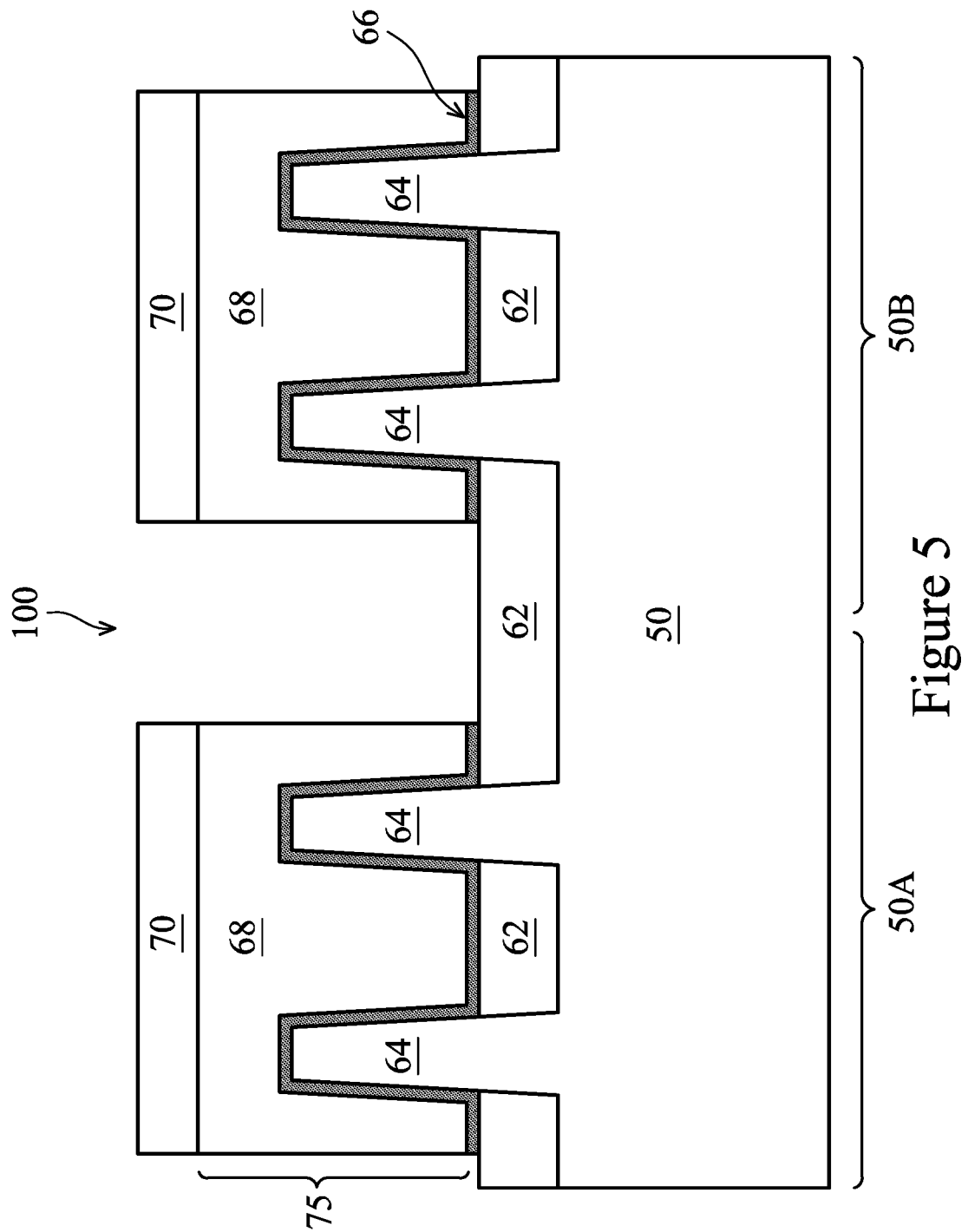

FIG. 5 illustrates the formation of gate structures 75 over the semiconductor fins 64 in the first region 50A and the second region 50B. A dielectric layer (not shown) is formed on the semiconductor fins 64 and the isolation regions 62. The dielectric layer may be, for example, silicon oxide, silicon nitride, multilayers thereof, or the like, and may be deposited or thermally grown according to acceptable techniques. In some embodiments, the dielectric layer may be a high-k dielectric material, and in these embodiments, dielectric layer may have a k value greater than about 7.0, and may include a metal oxide or a silicate of Hf, Al, Zr, La, Mg, Ba, Ti, Pb, multilayers thereof, and combinations thereof. The formation methods of dielectric layer may include molecular-beam deposition (MBD), atomic layer deposition (ALD), plasma-enhanced CVD (PECVD), and the like.

A gate layer (not shown) is formed over the dielectric layer, and a mask layer (not shown) is formed over the gate layer. The gate layer may be deposited over the dielectric layer and then planarized, such as by a CMP. The mask layer may be deposited over the gate layer. The gate layer may be formed of, for example, polysilicon, although other materials may also be used. In some embodiments, the gate layer may include a metal-containing material such as TiN, TaN, TaC, Co, Ru, Al, combinations thereof, or multi-layers thereof. The mask layer may be formed of, for example, silicon nitride or the like.

After the layers are formed, the mask layer may be patterned using acceptable photolithography and etching techniques to form mask 70. The pattern of the mask 70 then may be transferred to the gate layer and dielectric layer by an acceptable etching technique to form gate 68 and gate dielectric 66, respectively. The gate 68 and the gate dielectric 66 cover respective channel regions of the semiconductor fins 64. The gate 68 may also have a lengthwise direction substantially perpendicular to the lengthwise direction of respective semiconductor fins 64.

Figure 6:
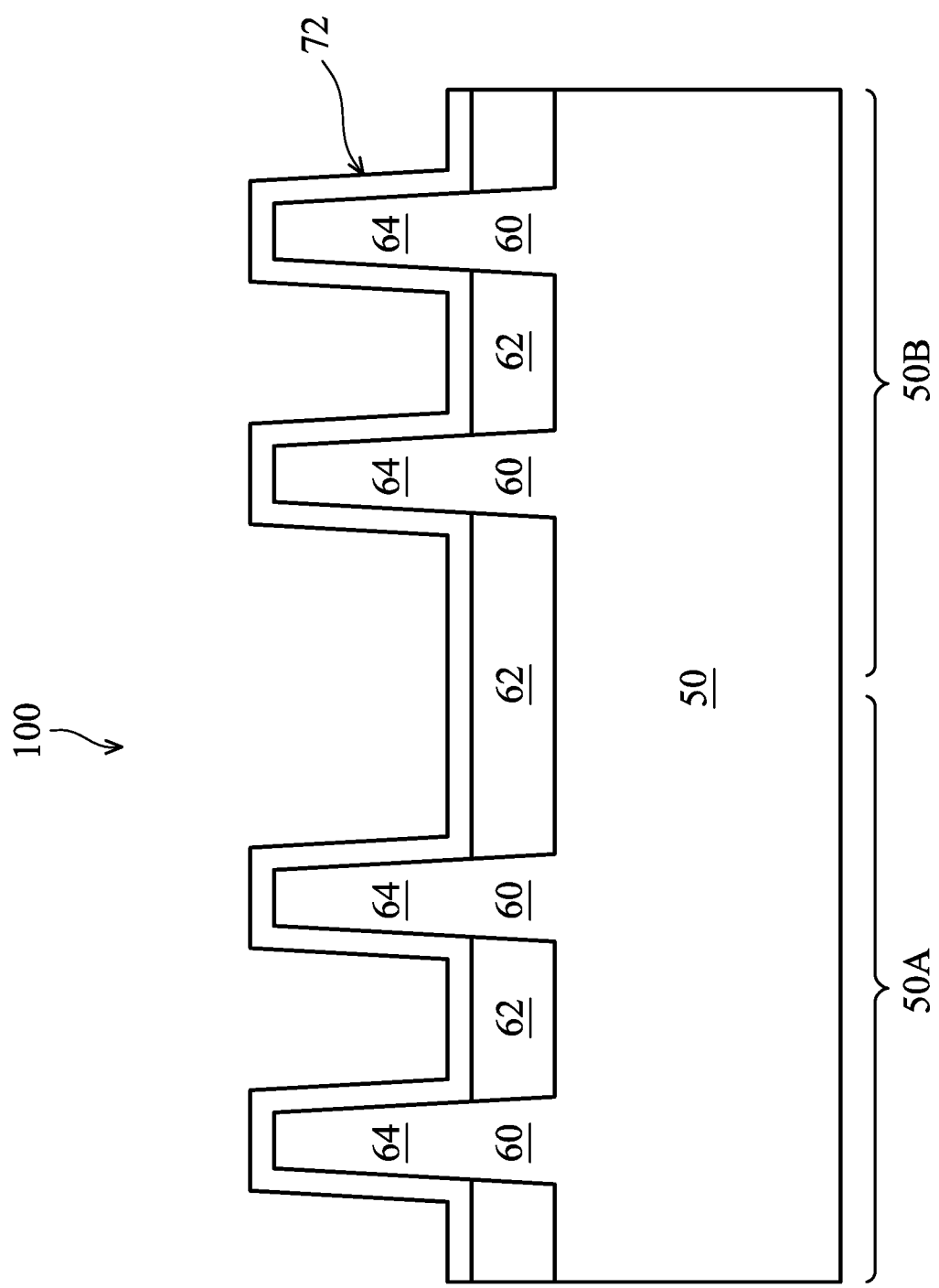

FIGS. 6-10 illustrate the cross-section views of the FinFET device 100 along cross-section C-C (across the fins in the source/drain regions). Referring first to FIG. 6, a gate seal spacer (may also be referred to as a spacer layer) 72 is formed on exposed surfaces of isolation regions 62, semiconductor fins 64, gate 68, and mask 70 in the first region 50A and the second region 50B. In some embodiments, the gate seal spacer 72 is formed blanketly over isolation regions 62, semiconductor fins 64, gate 68, and mask 70 in the first region 50A and the second region 50B. A thermal oxidation or a deposition process may form the gate seal spacer 72, which may have a thickness between about 35 angstrom to about 45 angstrom, such as 43 angstrom. In some embodiments, the gate seal spacer 72 may be formed of a nitride, such as silicon nitride, silicon oxynitride, silicon carbide, silicon carbonitride, the like, or a combination thereof.

Figure 7:
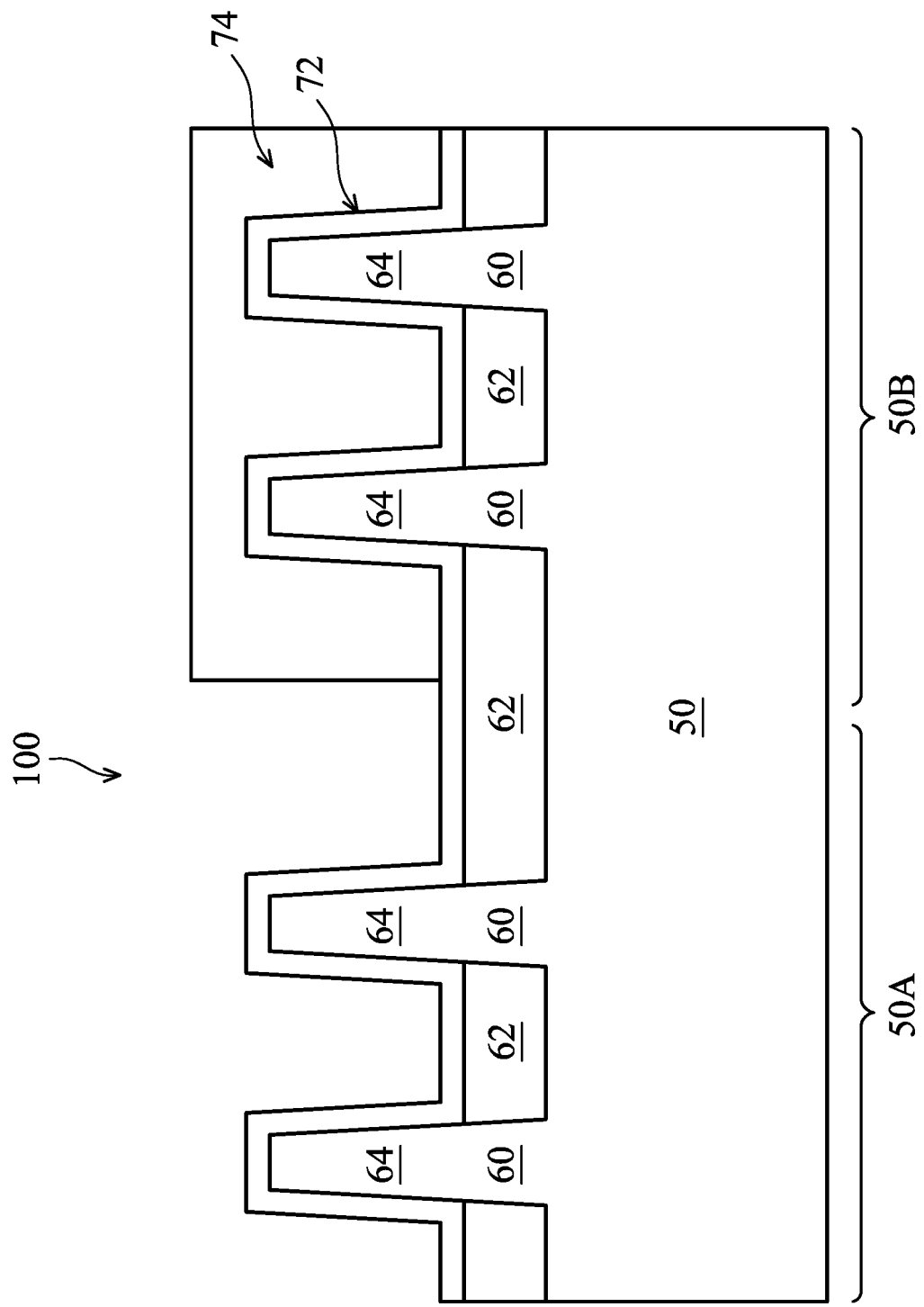

Next, as illustrated in FIG. 7, a mask layer 74, such as a photoresist (PR), is formed to cover the fins 64 in the second region 50B. In some embodiments, a photoresist is formed over the fins 64, the gate 68, the mask 70, and the isolation regions 62 in the first region 50A and the second region 50B. The photoresist is then patterned to expose the first region 50A (e.g., an NMOS region) while covering the second region 50B. The photoresist can be formed by using a spin-on technique and can be patterned using acceptable photolithography techniques. The mask layer 74 may be referred to as photoresist 74 in the description hereinafter, with the understanding that any suitable mask layer may be used.

Figure 8:
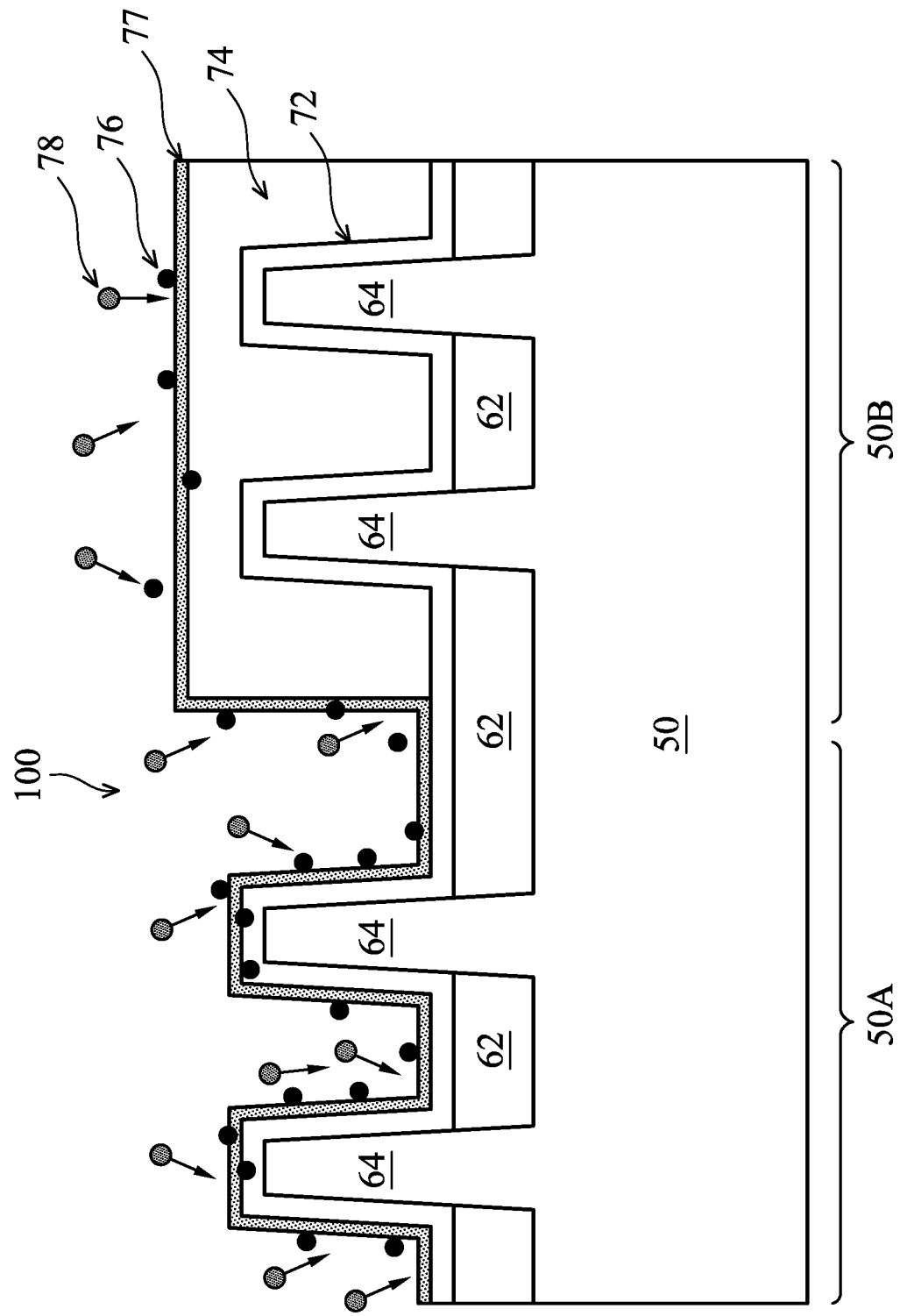

Referring to FIG. 8, a plasma process is performed for the FinFET device 100. The plasma process is a plasma doping process, in some embodiments. The plasma doping process deposits a layer 77 of the dopant over the gate seal spacer 72 and implants the dopant into the gate seal spacer 72, in some embodiments. In the illustrated embodiment, an N-type dopant, e.g., arsenic (As), is used in the plasma doping process to dope the gate seal spacer 72 in the first region 50A (e.g., an NMOS region) while the photoresist 74 shields the second region 50B (e.g., a PMOS region) from the plasma doping process. The plasma doping process may use a gas source comprising a suitable dopant (e.g., an N-type dopant) for the first region 50A (e.g., an NMOS region) and an inert gas. For example, the dopant may be As, and the inert gas may be xenon (Xe), helium (He), argon (Ar), neon (Ne), krypton (Kr), the like, or combinations thereof. The example in FIG. 8 is a non-limiting example, other suitable dopants may also be used. As an example, phosphorous (P) may be used as an N-type dopant. As another example, boron (B) may be used as a P-type dopant.

In an exemplary embodiment, the plasma doping process is performed using a gas source comprising about 5% to about 10% of As and about 90% to about 95% of Xe, with a flow rate of As between about 30 standard cubic centimeter per minute (sccm) to about 90 sccm, a flow rate of Xe between 80 sccm and 200 sccm, and an implantation energy between about 0.5 KV to about 2.5 KV. A dosage of the dopant (e.g., As) may be between about 1E19 atoms/cm$^3$ to about 1E21 atoms/cm$^3$. The gas source (e.g., As and Xe) may be activated into plasma by any suitable method of generating the plasma, such as transformer coupled plasma generator, inductively coupled plasma systems, magnetically enhanced reactive ion etching, electron cyclotron resonance, a remote plasma generator, or the like.

As illustrated in FIG. 8, the plasma doping process deposits a layer 77 comprising the dopant (e.g., As) over the FinFET device 100. A thickness of the layer 77 may be between about 5 nm to about 6 nm. FIG. 8 also illustrates As particles (e.g., ions) 76 and Xe particles (e.g., ions) 78 in the plasma doping process. The Xe particles 78 may collide with the As particles 76 and knock the As particles 76 deeper into the gate seal spacer 72. For example, the Xe particles 78 may knock As particles 76 through the deposited layer n and into the gate seal spacer 72 in the first region 50A. The As particles 76 may also enter photoresist 74 which will be removed in subsequent processing, thus the photoresist 74 shields the second region 50B (e.g., a PMOS region) from the doping process illustrated in FIG. 8.

Figure 9:
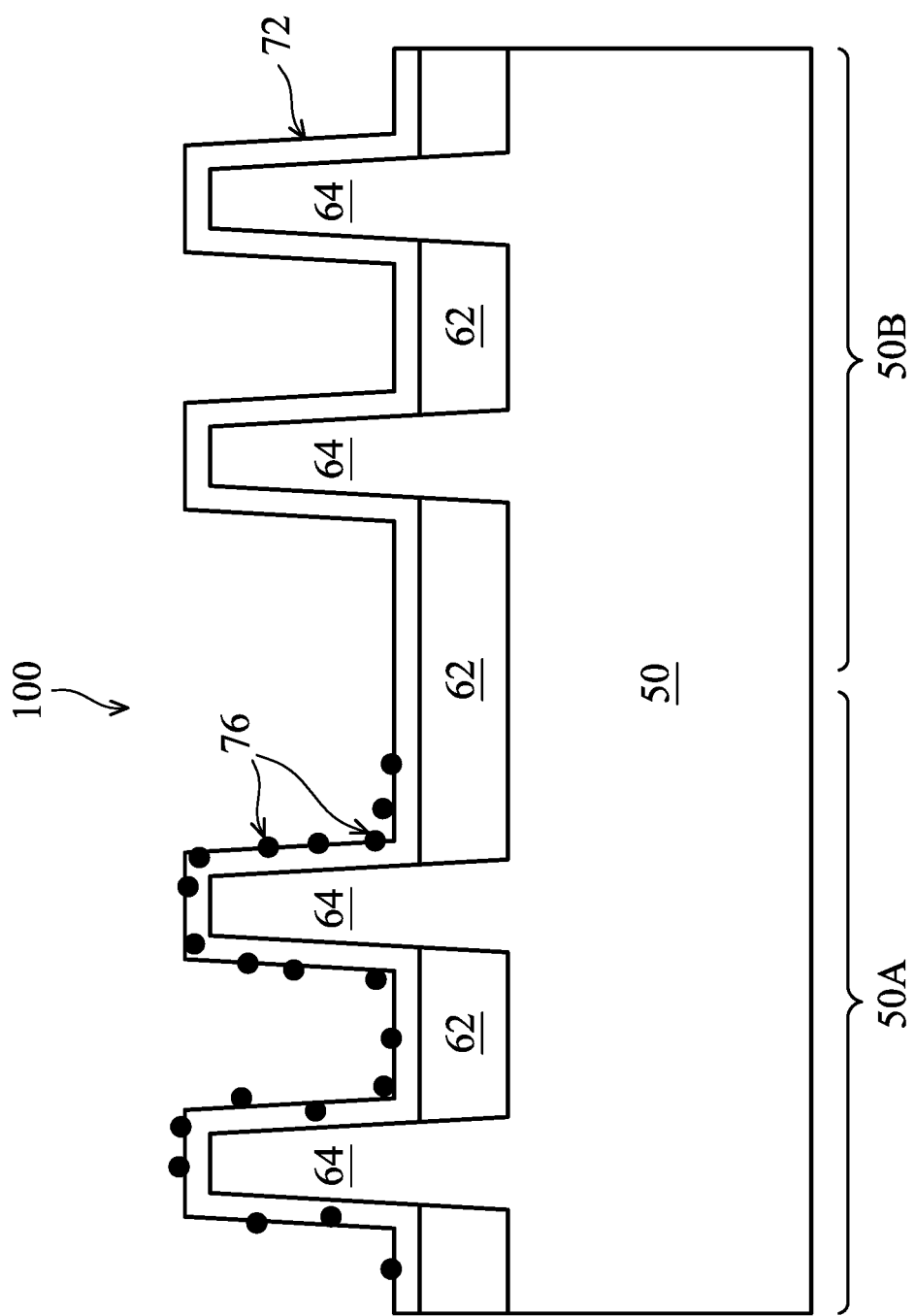

Referring to FIG. 9, the photoresist 74 is removed using a wet etch process or other suitable method. In some embodiments, a wet etch process is performed using Sulfuric Peroxide Mixture (SPM), which is an acid comprising H$_2$SO$_4$, and H$_2$O$_2$. The SPM may further comprise an SC-1 cleaning solution, which is a mixture of NH$_4$OH, H$_2$O$_2$ and deionized water. The SPM has an etch selectivity between the photoresist 74 and the gate seal spacer 72, such that the SPM removes photoresist 74 without substantially attacking the gate seal spacer 72, in some embodiments. The wet etch process conditions (e.g., time, temperature) are controlled such that the wet etch process removes the photoresist 74 and the deposited layer 7 without substantially removing the As particles 76 embedded in the gate seal spacer 72 in the first region 50A. In an exemplary embodiment, a wet etch process is performed for a time interval between about 30 seconds to about 60 seconds, such as 45 seconds, using a high temperature SPM solution at a temperature between about 150° C. to about 180° C.

The time and the temperature of the wet etch process using SPM disclosed above can be tuned to work with the implantation energy (e.g., between about 0.5 KV and about 2.5 KV) to reduce silicon loss (e.g., fin height loss) and to improve the on-current $I_{on}$ of the FinFET device 100. For example, the wet etch process recipe disclosed above results in little or no fin height loss (e.g., 0 nm to about 1 nm) and less than 2% reduction of the on-current $I_{on}$ of the FinFET device 100. In contrast, a longer wet etch process (e.g., 120 seconds) or a higher implantation energy level (e.g., 3 KV) may result in 3 nm of fin height loss and about 6% degradation in the on-current $I_{on}$ of the FinFET device. A shorter wet etch process (e.g., less than about 30 seconds), on the other hand, may not remove PR 74 and the gate seal spacer 72 sufficiently.

Referring now to Figure to, an anneal process 810 is performed. The anneal process may be performed in a same chamber as the doping process. Alternatively, the anneal process may be performed in a chamber different from the chamber used in the doping process. The anneal process 810 drives the As particles 76 embedded in the gate seal spacer 72 into fins 64 in the first region 50A, in some embodiments. In addition, the anneal process also activates the dopant (e.g., As) implanted. In an exemplary embodiment, the anneal process is a spike anneal process performed at a temperature between about 1000° C. and about 1050° C., such as 1045° C., for a time interval between about 1 second to about 2 seconds, and in a ambient comprising O2.

The high temperature (e.g., 1045° C.) anneal process 810 helps to drive the dopant As into the corresponding fins 64, however, such a high temperature also increases the outgassing of the dopant (e.g., As). Outgassing of the dopant results in lower concentration of the dopant in the LDD region 65 (see FIG. 11) to be formed in the fins 64 in the first region 50A. Outgassing may also pose a safety issue for the production tool. The O₂ in the ambient gas reduces outgassing of the dopant, in some embodiments. For example, the O₂ reacts (e.g., oxidizes) with the As at the surface of the fins 64 in the first region 50A and forms a oxide film (e.g., an oxide of As, not shown individually) over the fins 64. This oxide film serves to prevent or reduce outgassing of As during the anneal process 810. In an exemplary embodiment, the spike anneal process 810 is performed at a temperature between about 1000° C. and about 1050° C., such as 1045° C., in a gas environment comprising about 2% to about 3% of O2 and about 97% to about 98% of N2.

Figure 10:
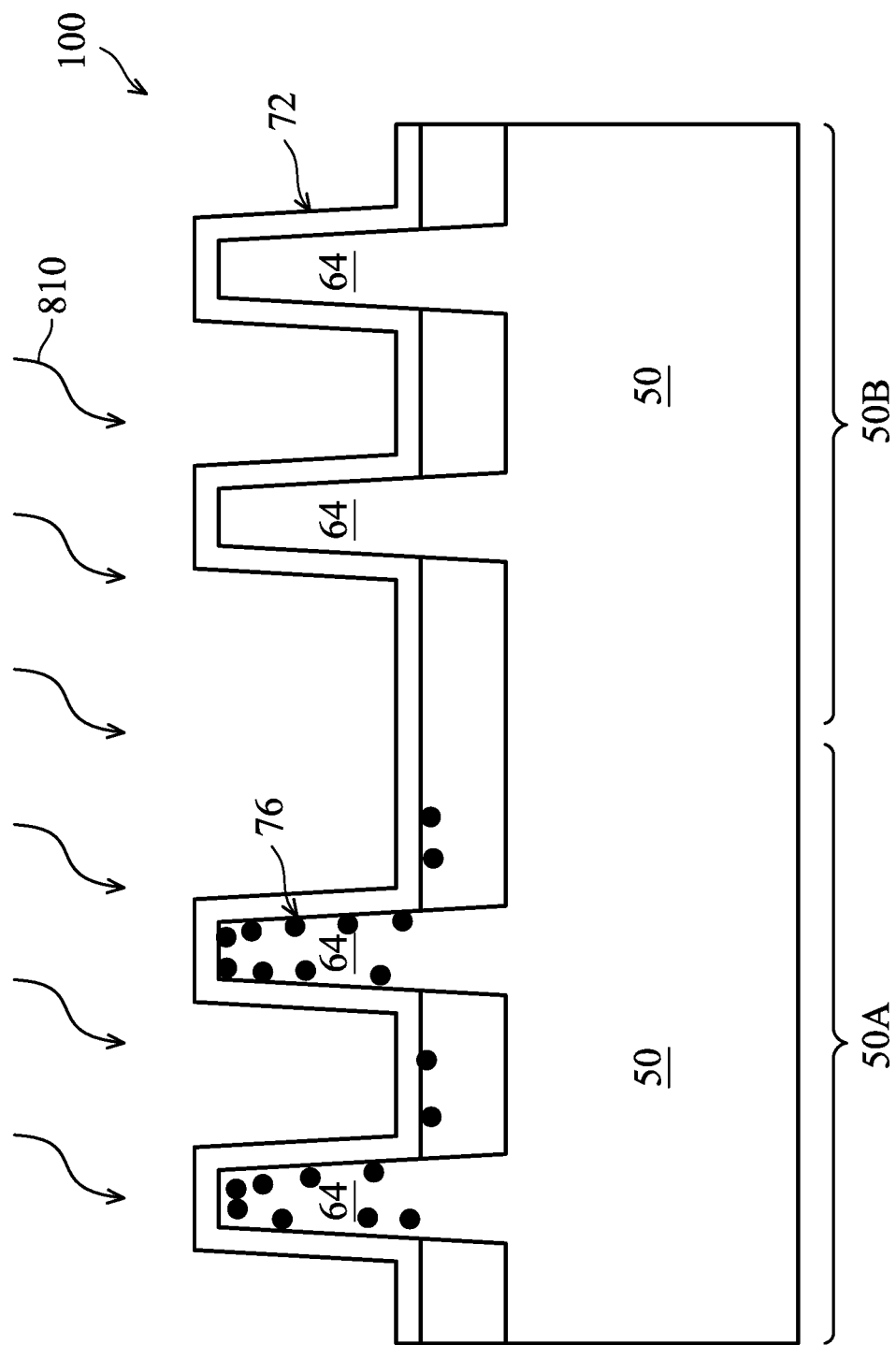

Although not visible in the cross-sectional view of FIGS. 8-10, the doping process may also implant the dopant (e.g., As) into the gate seal spacer 72 over the gate structure 75 in the first region 50A. Therefore, after the wet etch process and the anneal process, the dopant As may also enter the gate 68. However, since the dosage of the implanted dopant is low, the dopant in the gate 68 may not adversely impact the performance of the FinFET device 100. In embodiments where the gate 68 is replaced later by a replacement gate, e.g., in a gate-last process described below, the dopant will not affect the performance of the replacement gate formed later.

Figure 11:
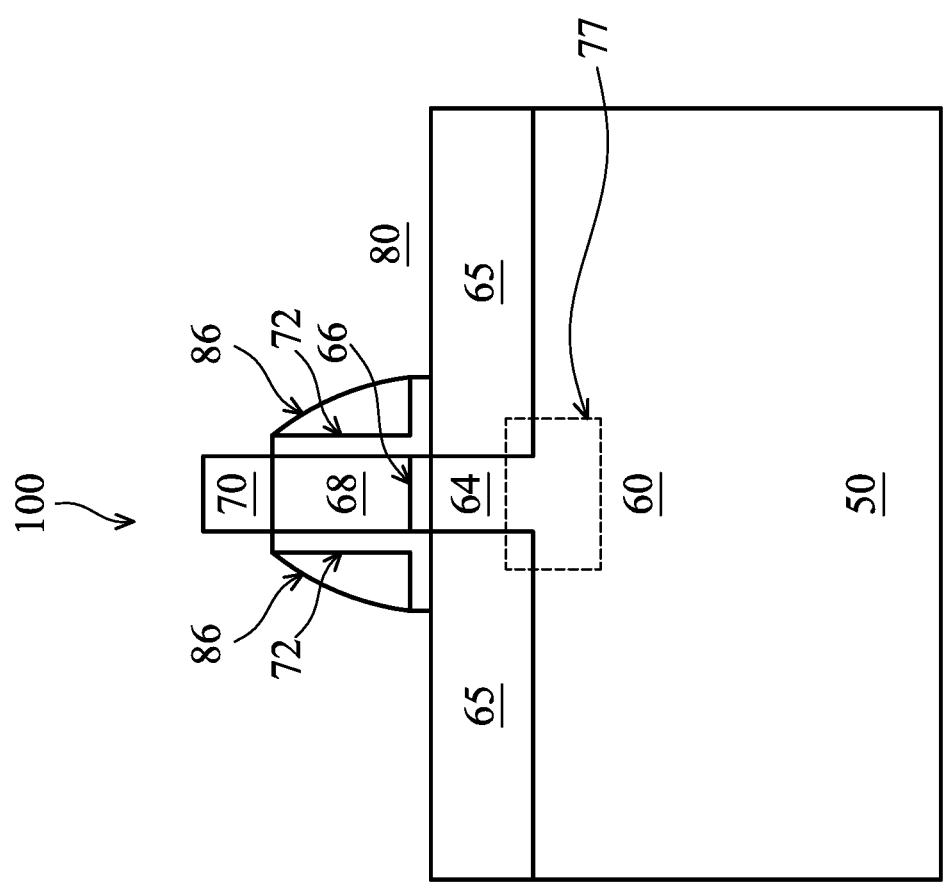

FIG. 11 illustrates the cross-sectional view of the FinFET device 100 along cross-section A-A of a fin 64 (along a longitudinal axis of the fin) in the first region 50A. As illustrated in FIG. 11, after the anneal process 810 is finished, LDD regions 65 are formed in the fins 64 in the first region 50A. FIG. 11 further illustrates gate spacers 86 on the gate seal spacer 72 along sidewalls of the gate structure. The gate spacers 86 may be formed by conformally depositing a material and subsequently anisotropically etching the material. The material of the gate spacers 86 may be silicon nitride, SiCN, a combination thereof, or the like. Portions of the gate seal spacer 72 outside of the sidewalls of the gate spacer 86 are then removed. In some embodiments, an anisotropic etch process, such as a dry etch process, may be used to remove portions of the gate seal spacer 72 outside of the sidewalls of the gate spacer 86. The shapes and formation methods of the gate seal spacer 72 and the gate spacer 86 are merely non-limiting examples, and other shapes and formation methods are possible. For example, the gate spacers 86 may be formed after the epitaxial source/drain regions 80 (see FIG. 12) are formed. In some embodiments, dummy gate spacers are formed on the gate seal spacer 72 before the epitaxial process of the epitaxial source/drain regions 80 illustrated in FIG. 12 and the dummy gate spacers are removed and replaced with the gate spacers 86 after the epitaxial source/drain regions 80 are formed.

As shown in FIG. 11, the LDD region 65 extends below gate seal spacer 72 and abuts the channel region of the FinFET device 100. The LDD region 65 has a substantially uniform dopant concentration along a vertical direction of FIG. 11, e.g., along a direction from an upper surface of the LDD region 65 to a lower boundary of the LDD region 65 opposing the upper surface of the LDD region 65. A concentration of the dopant (e.g., As) in the LDD region 65 changes abruptly at an interface between the LDD region 65 and the channel region of the FinFET device 100, in some embodiments. For example, the LDD region 65 may have a substantially uniform concentration of As, and the channel region is substantially free of As, thus there is a step change in the concentration of the dopant As at the interface between the LDD region 65 and the channel region of the FinFET device 100. The choice of dopant, e.g., arsenic, allows for such an abrupt change of dopant concentration at the interface between the LDD region 65 and the channel region of the FinFET device 100. In contrast, if phosphorous were used as the dopant for the first region 50A (e.g., an NMOS region), such an abrupt change of dopant concentration may not be achieved. The uniform dopant concentration and the abrupt change of concentration along the interface between the LDD region 65 and the channel region may advantageously reduce the resistance of the FinFET device 100 formed. Additionally, as illustrated in FIG. 11, the two LDD regions 65 extend into region 77 and form an NMOS overlap region, which may reduce channel resistance and increase the turn-on current of the FinFET device 100, thus improving the performance of the FinFET device 100.

Although not illustrated, LDD regions for the second region 50B (e.g., a PMOS region) may be formed, e.g., after the processing illustrated in FIGS. 7-10 and before the processing illustrated in FIG. 11. For example, a photoresist may be deposited and patterned to expose the second region 50B while covering the first region 50A. A plasma doing process may be performed to implant a P-type dopant (e.g., boron) in the gate seal spacer 72 in the second region 50B. A gas source for the plasma doping process may include boron (B) and an inert gas such as Xe, He, Ar, Ne, Kr, the like, or combinations thereof. The conditions (e.g., flow rate, implantation energy) for the plasma doping processing of the second region 50B may be similar to that of the first region 50A, thus details are not repeated. Next, a wet etch process similar to the wet etch process for the first region 50A may be performed to remove the photoresist and a deposited layer comprising the P-type dopant (e.g., boron), conditions (e.g., type of acid, temperature, time interval) of the wet etch process may be similar to those discussed above with reference to FIG. 9, thus are not repeated. Next, an anneal process, which may be similar to the anneal process described above with reference to Figure to may be performed to drive the P-type dopant into the fins 64 in the second region 50B, and to activate the P-type dopant, thereby forming LDD regions for the second region 50B.

Figure 12:
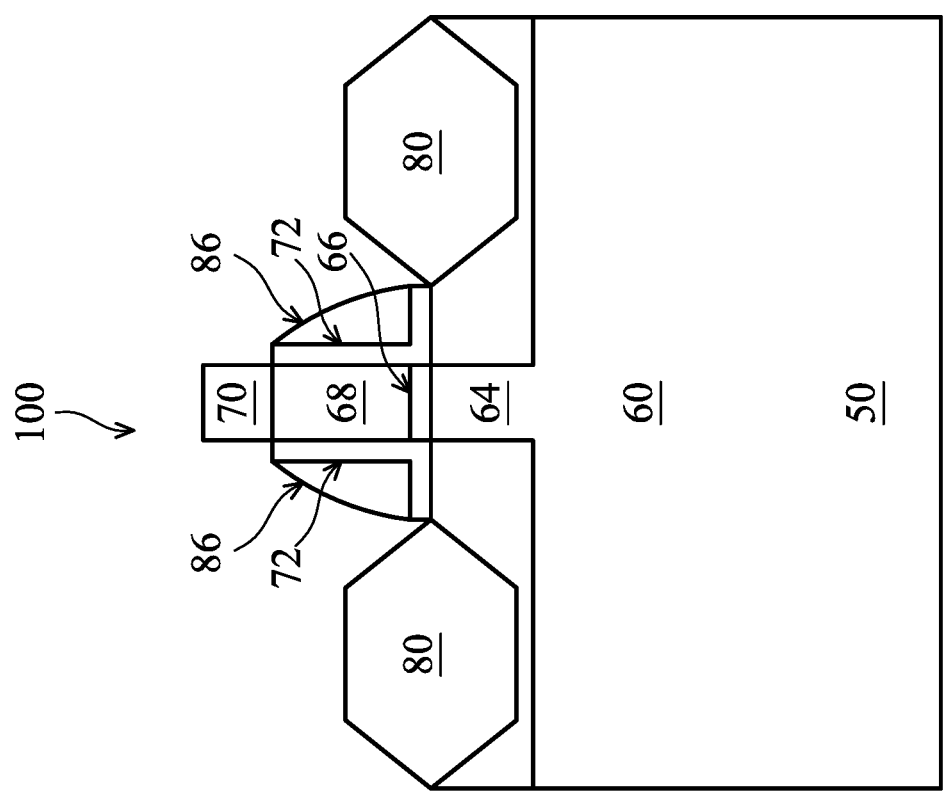

Next, as illustrated in FIG. 12, source/drain regions 80 are formed over the fins 64 in the first region 50A. The source/drain regions 80 are formed by etching the fins 64 to form recesses, and epitaxially growing a material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. A mask layer, such as photoresist may be formed over the semiconductor device 100 and patterned to expose the first region 50A and shield the second region 50B from the epitaixal grow process.

As illustrated in FIG. 12, the epitaxial source/drain regions 80 may have surfaces raised from respective surfaces of the fins 64 (e.g. raised above the non-recessed portions of the fins 64) and may have facets. The source/drain regions 80 of the adjacent fins 64 may merge to form a continuous epitaxial source/drain region 80. In some embodiments, the source/drain regions 80 for adjacent fins 64 do not merge together and remain separate source/drain regions 80. In some exemplary embodiments in which the resulting FinFET is an n-type FinFET, source/drain regions 80 comprise silicon carbide (SiC), silicon phosphorous (SIP), phosphorous-doped silicon carbon (SiCP), or the like. In alternative exemplary embodiments in which the resulting FinFET is a p-type FinFET, source/drain regions 80 comprise SiGe, and a p-type impurity such as boron or indium.

The epitaxial source/drain regions 80 may be implanted with dopants to form source/drain regions 80 followed by an anneal. The implanting process may include forming and patterning masks such as a photoresist to cover the regions of the FinFET that are to be protected from the implanting process. The source/drain regions 80 may have an impurity (e.g., dopant) concentration in a range from about 1E19 cm−3 to about 1E21 cm−3. In some embodiments, the epitaxial source/drain regions may be in situ doped during growth.

Although not illustrated, epitaxial source/drain regions 80 may also be formed over the fins 64 is the second region 50B (e.g., a PMOS region), following similar processing steps as illustrated above for the epitaxial source/drain regions 80 in the first region 50A (e.g., an NMOS region), but with the dopant type and the epitaxially grown material adjusted for the intended device type (e.g., P-type device). A mask layer, such as photoresist may be formed over the FinFET device 100 and patterned to expose the second region 50B and shield the first region 50A from the epitaixal grow process. Details of the formation of epitaxial source/drain regions 80 in the second region 50B are not discussed here.

Subsequent processing of the FinFET device 100 may be performed, such as the formation of one or more interlayer dielectrics and formation of contacts, details of which are not discussed here.

In some embodiments, a gate-last process (sometimes referred to as replacement gate process) may be used. In those embodiments, the gate 68 and the gate dielectric 66 may be considered dummy structures and will be removed and replaced with an active gate and active gate dielectric during subsequent processing.

Figure 13:
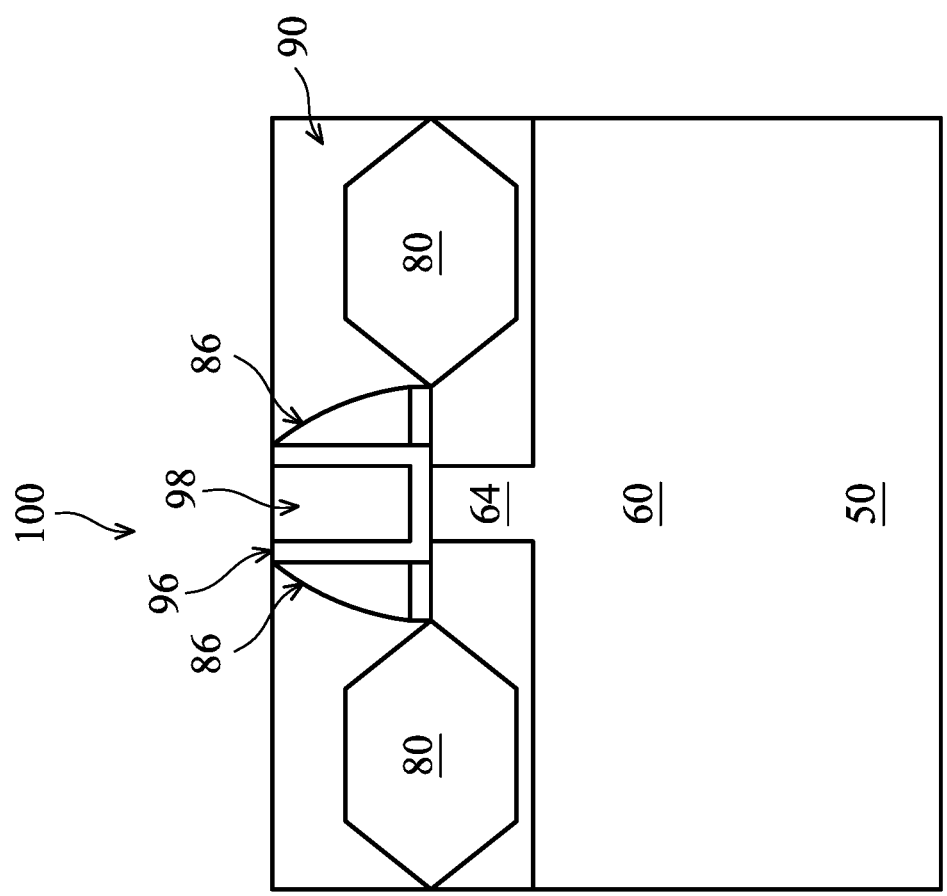
Figure 14:
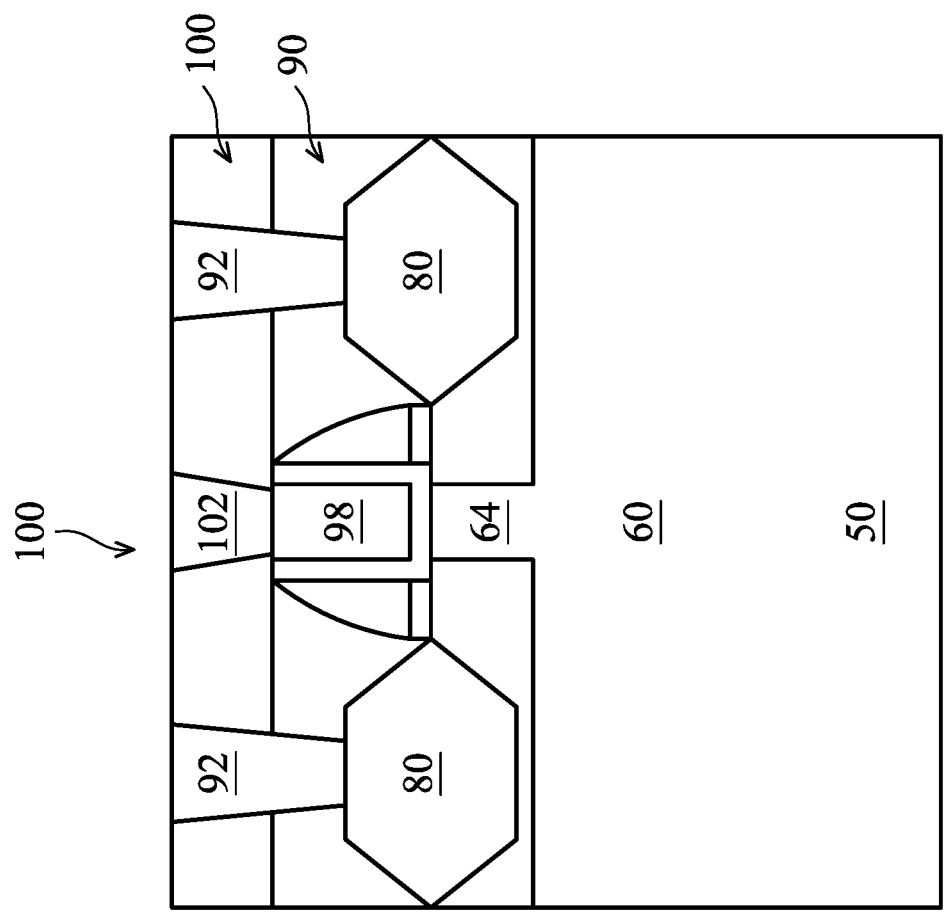

FIGS. 13 and 14 illustrate cross-sectional views of intermediate stages of processing of a gate-last structure in accordance with some embodiments. FIGS. 13 and 14 are cross-sectional views along the cross-section A-A of FIG. 1. In some embodiments, the processing steps illustrated in FIGS. 13 and 14 are performed for the first region 50A and the second region 50B at the same time to form replacement gates and contacts in both regions.

FIG. 13 illustrates a structure after the processing of FIG. 12 but with additional steps being performed. These additional steps include formation of an interlayer dielectric (ILD) 90 over the structure illustrated in FIG. 12, removing the gate 68 (sometimes referred to as a dummy gate 68 in this embodiment), gate seal spacer 72, and portions of the gate dielectric layer 66 (sometimes referred to as a dummy gate dielectric layer 66 in this embodiment) directly underlying the gate 68.

In some embodiments, the ILD 90 is formed of a dielectric material such as phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

In accordance with some embodiments, the gate 68, the gate dielectric 66, and the gate seal spacer 72 are removed in an etching step(s), so that recesses are formed. Each recess exposes a channel region of a respective fin 64. Each channel region is disposed between neighboring pairs of epitaxial source/drain regions 80. During the removal, the dummy gate dielectric layer 66 may be used as an etch stop layer when the dummy gate 68 is etched. The dummy gate dielectric layer 66 and gate seal spacer 72 may then be removed after the removal of the dummy gate 68.

Further, in FIG. 13, gate dielectric layer 96 and gate electrode 98 are formed for replacement gates. The gate dielectric layer 96 is deposited conformally in the recess, such as on the top surfaces and the sidewalls of the fins 64 and on sidewalls of the gate spacers 86, and on a top surface of the ILD 90. In accordance with some embodiments, the gate dielectric layer 96 comprises silicon oxide, silicon nitride, or multilayers thereof. In other embodiments, the gate dielectric layer 96 includes a high-k dielectric material, and in these embodiments, the gate dielectric layers 96 may have a k value greater than about 7.0, and may include a metal oxide or a silicate of Hf, Al, Zr, La, Mg, Ba, Ti, Pb, and combinations thereof. The formation methods of gate dielectric layer 96 may include MBD, ALD, PECVD, and the like.

Next, the gate electrode 98 is deposited over the gate dielectric layer 96, respectively, and fills the remaining portions of the recess. The gate electrode 98 may be made of a metal-containing material such as TiN, TaN, TaC, Co, Ru, Al, combinations thereof, or multi-layers thereof. After the filling of the gate electrode 98, a planarization process, such as a CMP, may be performed to remove the excess portions of gate dielectric layer 96 and the material of gate electrode 98, which excess portions are over the top surface of ILD 90. The resulting remaining portions of material of the gate electrode 98 and the gate dielectric layer 96 thus form a replacement gate of the resulting FinFET.

In FIG. 14, an ILD 100 is deposited over ILD 90. Further illustrated in FIG. 14, contacts 92 are formed through the ILD 100 and the ILD 90 and the contact 102 is formed through the ILD 100. In an embodiment, the ILD 100 is a flowable film formed by a flowable CVD method. In some embodiments, the ILD 100 is formed of a dielectric material such as PSG, BSG, BPSG, USG, or the like, and may be deposited by any suitable method, such as CVD and PECVD. Openings for the contacts 92 are formed through the ILDs 90 and 100. The opening for the contact 102 is formed through the ILD 100. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 100. The remaining liner and conductive material form the contacts 92 and 102 in the openings. An anneal process may be performed to form a silicide at the interface between the epitaxial source/drain regions 80 and the contacts 92, respectively. The contacts 92 are physically and electrically coupled to the epitaxial source/drain regions 80 and the contact 102 is physically and electrically coupled to the gate electrode 98.

Figure 15:
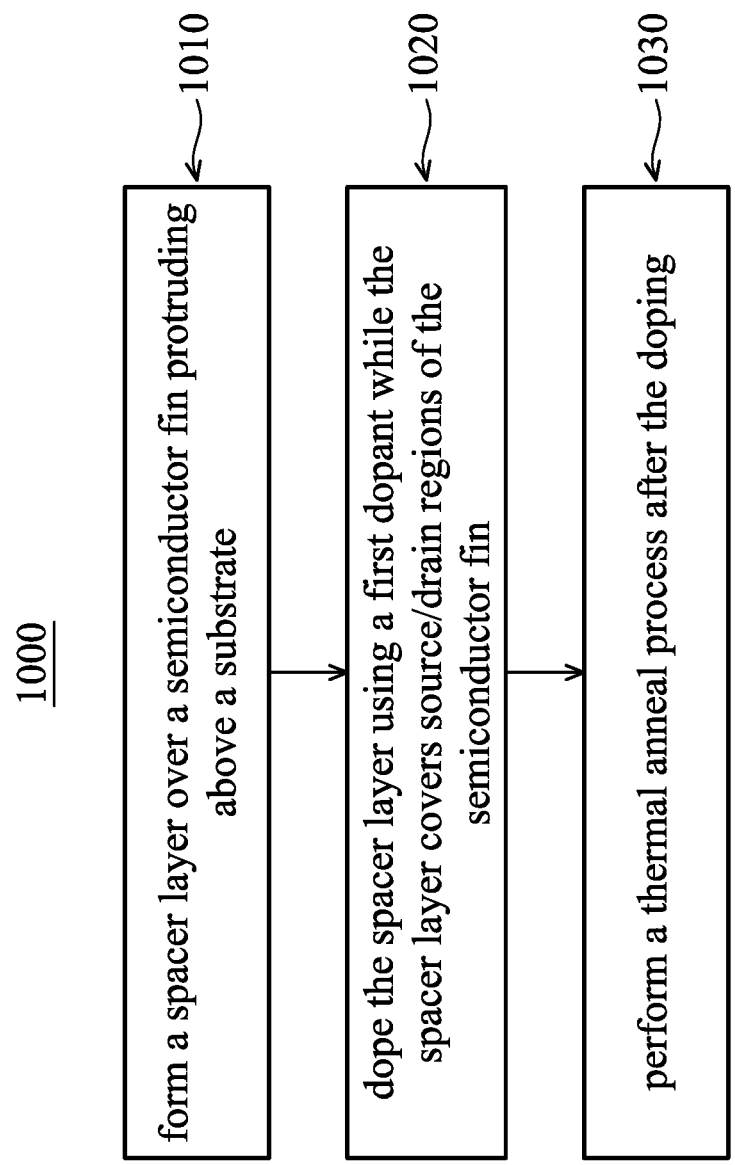
FIG. 15 illustrate a flow chart of a method of fabricating a semiconductor device, in accordance with some embodiments.

FIG. 15 illustrates a flow chart of a method of fabricating a semiconductor structure, in accordance with some embodiments. It should be understood that the embodiment method shown in FIG. 15 is merely an example of many possible embodiment methods. One of ordinary skill in the art would recognize many variations, alternatives, and modifications. For example, various steps as illustrated in FIG. 17 may be added, removed, replaced, rearranged and repeated.

Referring to FIG. 15, at step 1010, a spacer layer is formed over a semiconductor fin protruding above a substrate. At step 1020, the spacer layer is doped using a first dopant. At step 1030, a thermal anneal process is performed after the doping.

Embodiments may achieve advantages. By doping the spacer layer with As using a plasma doping process and annealing the dopant using a high temperature (e.g., 1045° C.) spike anneal process, the LDD region 65 has a substantially uniform dopant concentration from the top of the fin to the bottom of the fin, which advantageously reduces the resistance (e.g., contact resistance) of the FinFET device formed. In contrast, the conventional doping method for LDD region using ion beam tool cannot achieve uniform dopant distribution through the fin, because dopant profile is controlled by implantation angle, which is limited by factors such as the pitch between adjacent fins. Therefore, dopant concentration at bottom of the fins using ion beam tools is usually smaller than the dopant concentration at the top of the fins. The presently disclosed methods achieves a substantially uniform dopant concentration from the top of the fins to the bottom of the fins, and as a result, dopant concentration at the bottom of the fins using the presently disclosed method may be 8 times to 15 times larger than that using ion beam tools. In addition, the high temperature PR removal process using SPM is designed to work with the plasma doping process to reduce fin height loss and to reduce the degradation of the on-current of the FinFET device. Further, the O2 in the ambient gas of the anneal process reduces the outgassing of the dopant, thus improving the dopant concentration in the LDD region and avoids tool safety issues associated with outgassing.

In some embodiments, a method includes forming a spacer layer over a semiconductor fin protruding above a substrate, doping the spacer layer using a first dopant while the spacer layer covers source/drain regions of the semiconductor fin, and performing a thermal anneal process after the doping.

In other embodiments, a method includes forming a first fin in a first region of a semiconductor device and a second fin in a second region of the semiconductor device, forming a spacer layer over the first fin and the second fin, and forming a first mask layer over the spacer layer in the second region, the first mask layer covering the second fin, and the first fin being spaced apart from the first mask layer. The method also includes implanting a first dopant having a first doping type in the spacer layer over the first fin after the forming the first mask layer, where the spacer layer covers source/drain regions of the first fin during the implanting the first dopant. The method further includes removing the first mask layer after the implanting the first dopant, and performing a first anneal process.

In yet other embodiments, a method of forming a Fin Field-Effect Transistor (FinFET) device includes forming a first fin protruding above a substrate in a first region of a semiconductor device, forming a second fin protruding above the substrate in a second region of the semiconductor device, depositing a spacer layer over the first fin and the second fin, and covering the spacer layer in the second region with a photoresist (PR), where the spacer layer in the first region is exposed by the PR. The method also includes performing a plasma process using a gas comprising As and Xe, where the PR shields the spacer layer in the second region from the plasma process, and the spacer layer shields source/drain regions of the first fin from the plasma process, where the plasma process implants As in the spacer layer. The method further includes after the performing the plasma process, removing the PR using a Sulfuric Peroxide Mixture (SPM) solution, and after the removing the PR, performing an anneal process in an ambient comprising $O_2$ and $N_2$ to drive the implanted As from the spacer layer into the source/drain regions of the first fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
    forming a spacer layer over a semiconductor fin protruding above a substrate;
    after forming the spacer layer, doping the spacer layer using a first dopant while the spacer layer covers source/drain regions of the semiconductor fin, wherein the first dopant is an N-type or P-type dopant, wherein doping the spacer layer comprises depositing a layer comprising the first dopant over the spacer layer;
    removing the layer comprising the first dopant; and
    performing a thermal anneal process after the removing the layer comprising the first dopant.

2. The method of claim 1, wherein the doping comprises doping the spacer layer using a plasma doping process.

3. The method of claim 2, wherein the plasma doping process is performed using a gas source comprising the first dopant and an inert gas.

4. The method of claim 3, wherein the first dopant is As, and the inert gas is selected from the group consisting essentially of Xe, He, Ar, Ne, and Kr.

5. The method of claim 4, wherein the gas source of the plasma doping process comprises about 5% to about 10% of As and about 90% to about 95% of Xe.

6. The method of claim 5, wherein the plasma doping process is performed with an implantation energy of about 0.5 KV to about 2.5 KV.

7. The method of claim 1, wherein the removing the layer comprising the first dopant is performed using a Sulfuric Peroxide Mixture (SPM) solution.

8. The method of claim 7, wherein the removing is performed for a time interval between about 30 seconds to about 60 seconds at a temperature between about 150° C. to about 180° C.

9. The method of claim 1, wherein the performing the thermal anneal process comprises performing the thermal anneal process at a temperature between about 1000° C. to about 1050° C.

10. The method of claim 9, wherein the thermal anneal process is performed in an ambient comprising O2.

11. The method of claim 9, wherein the thermal anneal process is performed in a gas environment comprising about 2% to 3% of O2 and about 97% to 98% of N2.

12. A method comprising:
    forming a first fin in a first region of a semiconductor device and a second fin in a second region of the semiconductor device;

forming a spacer layer over the first fin and the second fin;

forming a first mask layer over the spacer layer in the second region, the first mask layer covering the second fin, and the first fin being spaced apart from the first mask layer;

implanting a first dopant in the spacer layer over the first fin after the forming the first mask layer, wherein the spacer layer covers source/drain regions of the first fin during the implanting the first dopant, wherein the first dopant is an N-type or P-type dopant, wherein the implanting the first dopant forms a deposited layer comprising the first dopant over the spacer layer;

removing the first mask layer and the deposited layer after the implanting the first dopant; and performing a first anneal process.

13. The method of claim 12, wherein the first dopant is As, and the implanting comprises performing a plasma doping process using As and Xe.

14. The method of claim 12, wherein the removing the first mask layer and the deposited layer comprises removing the first mask layer and the deposited layer using a Sulfuric Peroxide Mixture (SPM) solution at a temperature between about 150° C. to about 180° C.

15. The method of claim 12, wherein the first anneal process is performed at a temperature between about 1000° C. to about 1050° C. in an ambient comprising oxygen.

16. The method of claim 12, further comprising, after the performing the first anneal process:

forming a second mask layer over the spacer layer in the first region, the second mask layer covering the first fin, and the second fin being spaced apart from the second mask layer;

implanting a second dopant having a second doping type different from the first doping type in the spacer layer over the second fin after the forming the second mask layer;

removing the second mask layer after the implanting the second dopant; and performing a second anneal process.

17. A method of forming a Fin Field-Effect Transistor (FinFET) device comprising:

forming a first fin protruding above a substrate in a first region of a semiconductor device;

forming a second fin protruding above the substrate in a second region of the semiconductor device;

depositing a spacer layer over the first fin and the second fin;

covering the spacer layer in the second region with a photoresist (PR), wherein the spacer layer in the first region is exposed by the PR;

performing a plasma process using a gas comprising As and Xe, wherein the PR shields the spacer layer in the second region from the plasma process, and the spacer layer shields source/drain regions of the first fin from the plasma process, wherein the plasma process implants As in the spacer layer, wherein the plasma process forms a deposited layer comprising As over the spacer layer;

after the performing the plasma process, removing the PR and the deposited layer using a Sulfuric Peroxide Mixture (SPM) solution; and after the removing the PR, performing an anneal process in an ambient comprising O2 and N2 to drive the implanted As from the spacer layer into the source/drain regions of the first fin.

18. The method of claim 17, wherein the plasma process comprises a plasma doping process using a gas comprising about 5% to about 10% of As and about 90% to about 95% of Xe, and wherein an implantation energy of the plasma doping process is between about 0.5 KV to about 2.5 KV.

19. The method of claim 17, wherein the SPM solution is at a temperature between about 150° C. to about 180° C., and the anneal process is performed at a temperature between about 1000° C. to about 1050° C.

20. The method of claim 17, wherein the performing the plasma process comprises a flow rate of As between about 30 sccm to about 90 sccm and a flow rate of Xe between 80 sccm and 200 sccm.

* * * * *